(12) United States Patent
Welsch et al.

(10) Patent No.: US 10,509,050 B2
(45) Date of Patent: Dec. 17, 2019

(54) SENSOR HOUSING FOR A WHEEL SENSOR DEVICE, WHEEL SENSOR DEVICE AND CONNECTING COMPONENT THEREOF

(71) Applicant: Robert Bosch GmbH, Stuttgart (DE)

(72) Inventors: Wolfgang Welsch, Heidelberg (DE); Bernd Tepass, Beilstein (DE); Oliver Hahn, Obergruppenbach (DE); Mirko Scheer, Suzhou Industrial Park (CN); Robert Remus, Mundelsheim (DE)

(73) Assignee: Robert Bosch GmbH, Stuttgart (DE)

( * ) Notice: Subject to any disclaimer, the term of this patent is extended or adjusted under 35 U.S.C. 154(b) by 1 day.

(21) Appl. No.: 15/548,350

(22) PCT Filed: Jan. 15, 2016

(86) PCT No.: PCT/EP2016/050802
§ 371 (c)(1),
(2) Date: Aug. 2, 2017

(87) PCT Pub. No.: WO2016/128175
PCT Pub. Date: Aug. 18, 2016

(65) Prior Publication Data
US 2018/0024156 A1 Jan. 25, 2018

(30) Foreign Application Priority Data
Feb. 10, 2015 (DE) .................. 10 2015 202 333

(51) Int. Cl.
*G01M 17/007* (2006.01)
*G01P 1/02* (2006.01)
(Continued)

(52) U.S. Cl.
CPC .............. *G01P 1/026* (2013.01); *B60T 8/326* (2013.01); *B60T 13/662* (2013.01); *G01D 3/08* (2013.01);
(Continued)

(58) Field of Classification Search
USPC ..................................... 73/115.08
See application file for complete search history.

(56) References Cited

U.S. PATENT DOCUMENTS 4,358,828 A * 11/1982 Reid .................. G01P 3/66
324/166
5,965,825 A * 10/1999 Nitecki ................ G01D 5/145
222/71
(Continued)

FOREIGN PATENT DOCUMENTS

DE 198 40 944 A1 3/2000
DE 100 41 989 A1 3/2002
(Continued)

OTHER PUBLICATIONS

International Search Report corresponding to PCT Application No. PCT/EP2016/050802, dated Aug. 12, 2016 (German and English language document) (10 pages).

*Primary Examiner* — Eric S. McCall
(74) *Attorney, Agent, or Firm* — Maginot, Moore & Beck LLP (57) ABSTRACT

A sensor housing for a wheel-sensor device for a vehicle includes a first receiving aperture, a second receiving aperture, a first rotational-speed sensor, a rotary transducer, and a second rotational-speed sensor. The first sensor is configured to be inserted into the first aperture, and the sensor housing with the inserted first sensor is configured to be mounted on the vehicle. The rotary transducer is configured to co-rotate with a vehicle wheel and to trigger a change in a first physical quantity. The second sensor is configured to be inserted adjacent to the first sensor in the first aperture or in the second aperture, and the sensor housing, with the inserted first and second sensors, is configured to be mounted on the vehicle. The rotary transducer co-rotating with the rotating wheel triggers the change in the first physical quantity and a change in a second physical quantity.

8 Claims, 8 Drawing Sheets

(51) Int. Cl.
    *G01P 3/487* (2006.01)
    *G01P 3/488* (2006.01)
    *B60T 8/32* (2006.01)
    *B60T 13/66* (2006.01)
    *G01D 3/08* (2006.01)
    *B60T 13/74* (2006.01)
    *G01D 5/244* (2006.01)
    *G01R 33/07* (2006.01)

(52) U.S. Cl.
    CPC .............. *G01P 3/487* (2013.01); *G01P 3/488* (2013.01); *B60T 13/746* (2013.01); *B60T 2270/413* (2013.01); *G01D 5/24476* (2013.01); *G01R 33/07* (2013.01)

(56) References Cited

U.S. PATENT DOCUMENTS

| | | | |
|---|---|---|---|
| 6,019,086 A | 2/2000 | Schneider et al. | |
| 6,776,058 B1 * | 8/2004 | Schroeder | G01L 3/104 73/862.333 |
| 2005/0115317 A1 * | 6/2005 | Fouquet | B29C 45/1671 73/494 |
| 2010/0218619 A1 * | 9/2010 | Dougherty | G01L 5/221 73/862.335 |
| 2015/0096371 A1 * | 4/2015 | O'Neil | G01H 1/003 73/488 |
| 2015/0204898 A1 * | 7/2015 | Noda | G01P 1/00 73/493 |
| 2016/0076973 A1 * | 3/2016 | White | G01M 17/013 73/115.08 |
| 2016/0334290 A1 * | 11/2016 | Mol | G01L 5/0023 |
| 2017/0276570 A9 * | 9/2017 | White | B60C 23/0433 |
| 2017/0336278 A1 * | 11/2017 | Mol | F16C 41/007 |
| 2019/0023128 A1 * | 1/2019 | Tesar | B60K 17/046 |

FOREIGN PATENT DOCUMENTS

| | | |
|---|---|---|
| DE | 10 2010 047 128 A1 | 4/2012 |
| DE | 10 2011 002 741 A1 | 7/2012 |
| DE | 11 2010 003 926 T5 | 12/2012 |
| JP | H06-12966 U | 2/1994 |
| JP | 6-174736 A | 6/1994 |
| JP | 2000-85556 A | 3/2000 |
| JP | 2010-32357 A | 2/2010 |
| JP | 2011-508894 A | 3/2011 |

* cited by examiner

SENSOR HOUSING FOR A WHEEL SENSOR DEVICE, WHEEL SENSOR DEVICE AND CONNECTING COMPONENT THEREOF

This application is a 35 U.S.C. § 371 National Stage Application of PCT/EP2016/050802, filed on Jan. 15, 2016, which claims the benefit of priority to Serial No. DE 10 2015 202 333.8, filed on Feb. 10, 2015 in Germany, the disclosures of which are incorporated herein by reference in their entirety.

The disclosure relates to a sensor housing for a wheel-sensor device for a vehicle and to a wheel-sensor device for a vehicle. The disclosure also relates to a connecting component for interacting with the wheel-sensor device. Moreover, the disclosure relates to a production method for a wheel-sensor device for a vehicle and to a method for mounting a wheel-sensor device.

BACKGROUND

A wheel-bearing device with an integrated speed-detection device is described in DE 11 2010 003 926 T5. The integrated speed-detection device exhibits a sensor unit with a rotational-speed sensor, which has been integrated into a sensor receptacle of the wheel-bearing device.

SUMMARY

The disclosure provides a sensor housing for a wheel-sensor device for a vehicle, a wheel-sensor device for a vehicle having the features of additional descriptions, drawings, and claims, a connecting component for interacting with the wheel-sensor device, a production method for a wheel-sensor device for a vehicle, and a method for mounting a wheel-sensor device.

The present disclosure provides easily realizable possibilities for ascertaining information relating to a rotary behavior of a (single) wheel—such as, for example, a rotational speed and/or an angular velocity of the wheel by means of two rotational-speed sensors. For example, the sensor housing according to the disclosure for a wheel-sensor device facilitates a joint arrangement of the first rotational-speed sensor and the second rotational-speed sensor adjacent to the assigned (same) wheel. In this case, the mounting of the two rotational-speed sensors on the (same) wheel requires no additional effort or hardly any additional effort in comparison with a conventional mounting of only one rotational-speed sensor per wheel.

Through the use of the two rotational-speed sensors when ascertaining the information relating to the rotary behavior of the wheel (such as, for example, the rotational speed and/or angular velocity of the respective wheel), the numerical values can be established with a greater accuracy and with a lower frequency of errors. In addition, a failure or functional impairment of the first rotational-speed sensor can be compensated reliably by means of the second rotational-speed sensor which can still be employed. Correspondingly, an at least intermittent failure of the second rotational-speed sensor can also be overcome by means of the first rotational-speed sensor.

By reason of the more accurate establishment of the rotational speed and/or angular velocity of the respective wheel, with simultaneously ensured low error-rate, which is guaranteed by means of the present disclosure, a deceleration requested by a driver or by an automatic speed-control system can, as a rule, be realized better while retaining a desired stability of the respective vehicle. By reason of the availability of up-to-date values relating to the rotary behavior of the wheel, which continues to be ensured by means of the present disclosure despite a failure of one of the rotational-speed sensors, enables the maintenance of a braking control system and hence also the maintenance of braking comfort even in such a situation.

In an advantageous embodiment of the sensor housing or wheel-sensor device, the sensor housing includes a three-pin, four-pin or 2-×-2-pin plug component, the first rotational-speed sensor and the second rotational-speed sensor each having been connected to the plug component. Advantageous exemplary embodiments of the plug component that can be realized inexpensively will be described below.

The plug component can preferentially be directly or indirectly connected to a first voltage source of the vehicle in such a way that a first voltage can be made available at least to the first rotational-speed sensor. In addition, the plug component may be capable of being directly or indirectly connected to a second voltage source of the vehicle in such a way that a second voltage can be made available at least to the second rotational-speed sensor. In this way, it can be guaranteed that even in the event of a failure of one of the two voltage sources (current sources) at least one of the two rotational-speed sensors is still operational.

In preferred manner, the plug component can be directly or indirectly connected to a first electronic control unit of the vehicle in such a way that at least one first sensor signal relating to the change in the at least one first physical quantity in the first rotational-speed sensor and/or in a first item of information, derived therefrom, relating to a rotary behavior of the wheel can be output to the first electronic control unit. In an advantageous design of the wheel-sensor device, the plug component can also be directly or indirectly connected to a second electronic control unit of the vehicle in such a way that at least one second sensor signal relating to the change in the at least one second physical quantity in the second rotational-speed sensor and/or in a second item of information, derived therefrom, relating to the rotary behavior of the wheel can be output to the second electronic control unit. This improves the availability of at least one of the sensor signals to at least one of the electronic control units, as a result of which it can be ensured that (almost) always at least one of the electronic control units is able to drive at least one vehicle component capable of being driven by it, by taking into consideration a rotary behavior of the wheel assigned to the wheel-sensor device.

In a further advantageous embodiment of the sensor housing or of the wheel-sensor device, the sensor housing with the inserted first rotational-speed sensor and with the inserted second rotational-speed sensor can be mounted on the vehicle adjacent to the wheel and to the rotary transducer in a wheel-bearing device. (By the term "wheel-bearing device", a wheel bearing, for example, may be understood, without the wheel-bearing device being restricted to a particular type of wheel bearing.) This allows a continual re-establishment of up-to-date values relating to the rotary behavior of the respective wheel with a high accuracy and with a low error-rate.

The connecting component according to the disclosure for interacting with the corresponding wheel-sensor device makes possible a connection of the wheel-sensor device to the first voltage source, to the first electronic control unit, to the second voltage source and/or to the second electronic control unit by means of a mounting method which is comparatively easy to implement and not labor-intensive. The advantages described above can also be provided by implementing the corresponding production method for a wheel-sensor device for a vehicle. Attention is drawn to the fact that the production method is capable of being developed further in accordance with the various embodiments of the sensor housing or of the wheel-sensor device.

Moreover, the corresponding method for mounting a corresponding wheel-sensor device also ensures the advantages described above. The method for mounting the wheel-sensor device is also capable of being developed further in accordance with the embodiments of the sensor housing or of the wheel-sensor device described above.

BRIEF DESCRIPTION OF THE DRAWINGS

Further features and advantages of the present disclosure will be elucidated in the following with reference to the figures. Shown are.

DETAILED DESCRIPTION

Figure 1A:
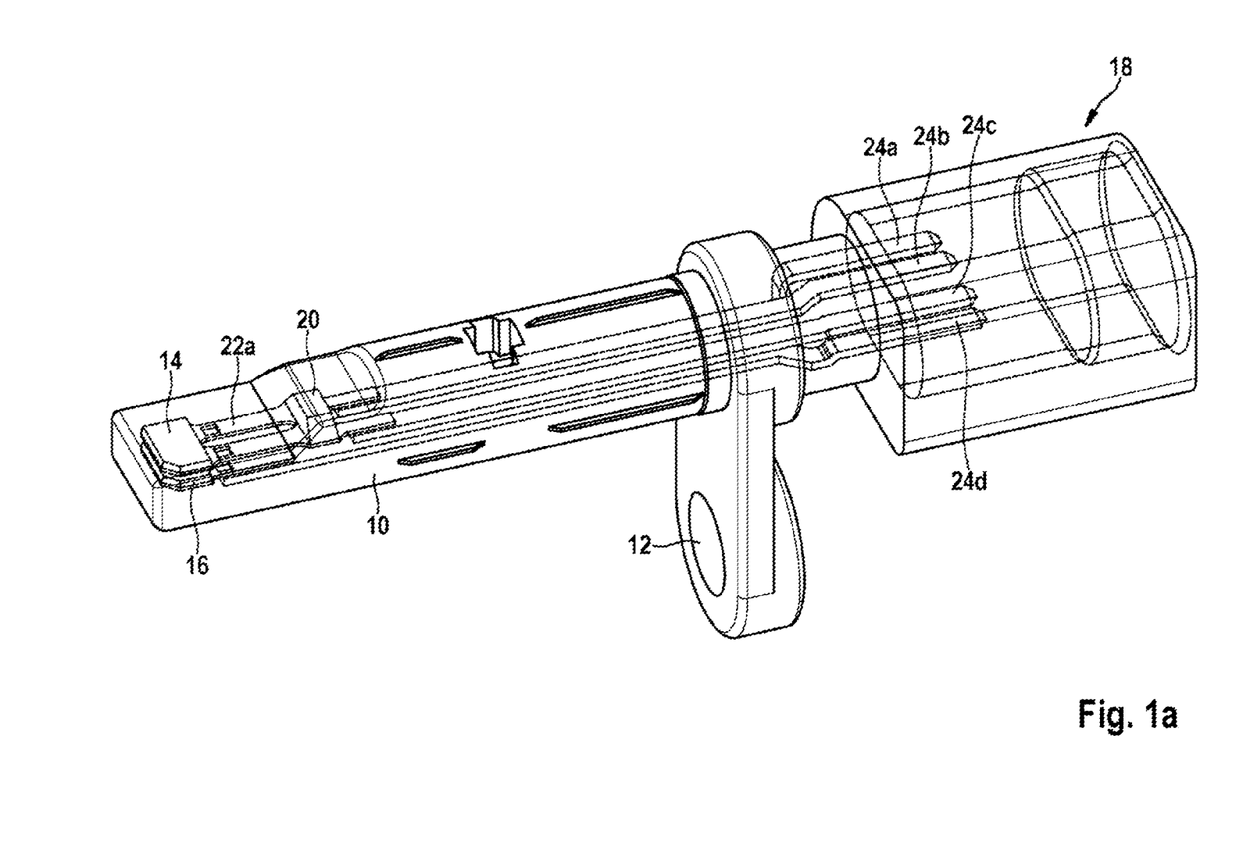
FIGS. 1a to 1c schematic overall and partial representations of a first embodiment of the wheel-sensor device.
Figure 1B:
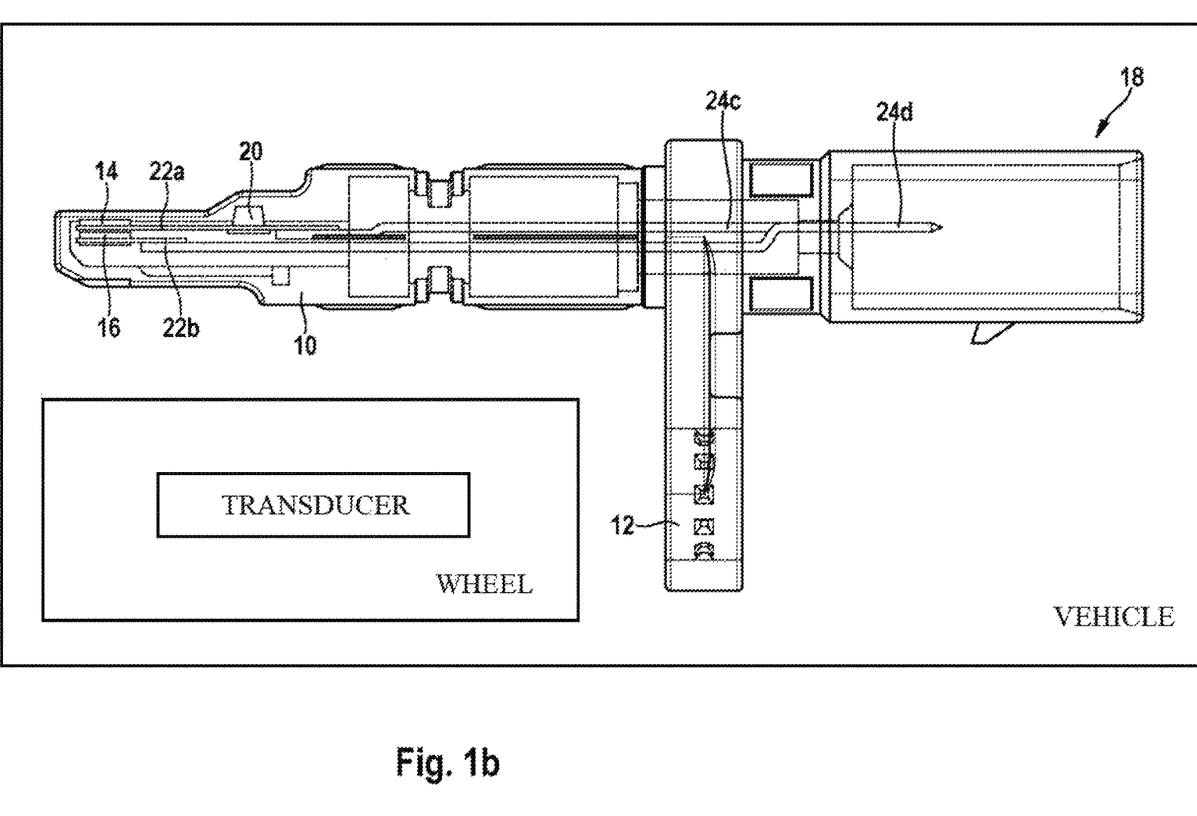
Figure 1C:
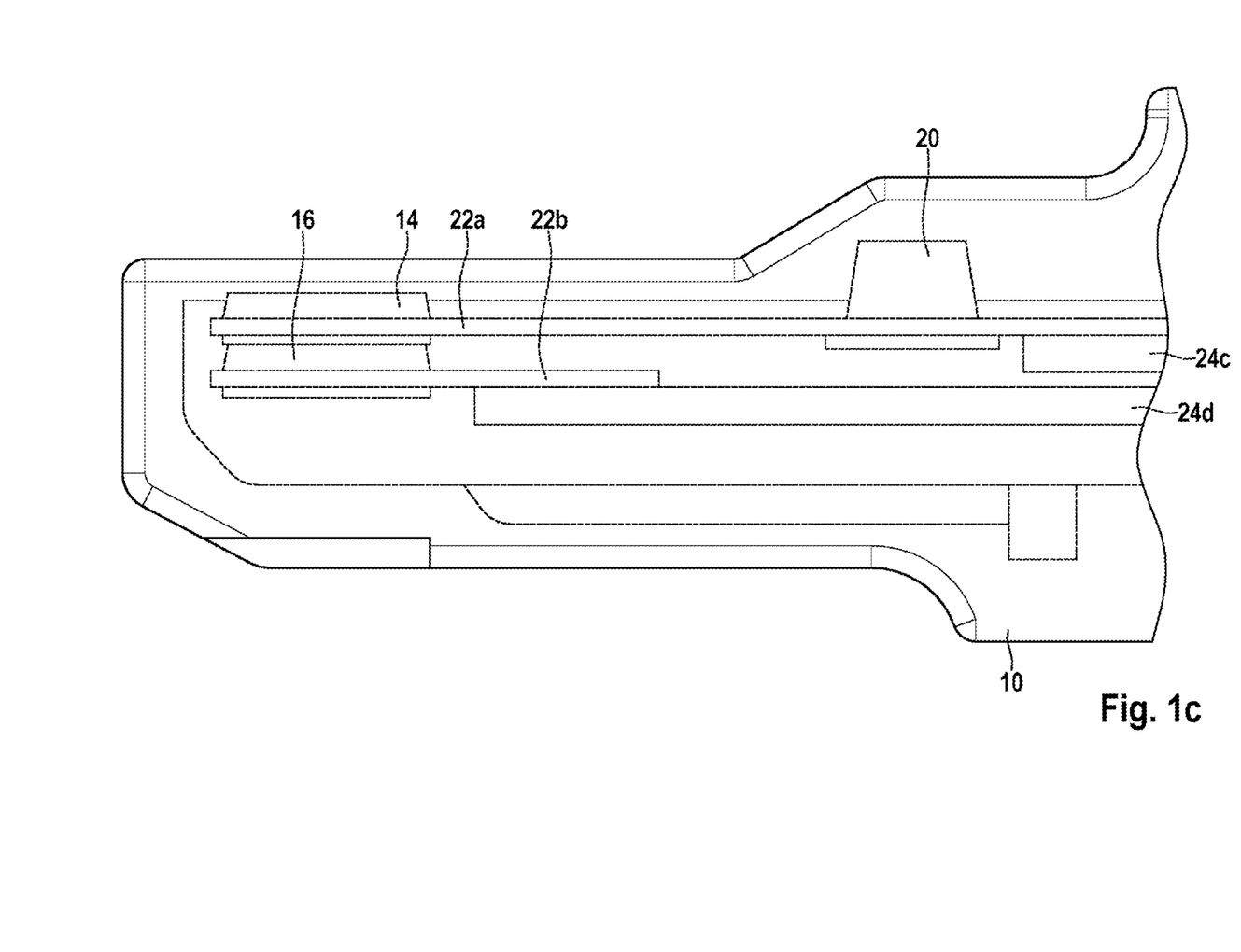

FIGS. 1a to 1c show schematic overall and partial representations of a first embodiment of the wheel-sensor device.

The wheel-sensor device represented schematically in FIGS. 1a to 1c has a sensor housing 10 which can be mounted on a (motor) vehicle in such a manner that the wheel-sensor device is able to interact, in the manner described below, with a rotary transducer fitted (directly or indirectly) to a wheel of the vehicle. Attention is drawn to the fact that the usability of the sensor housing 10 is not limited to a particular type of (motor) vehicle. The shape of the sensor housing 10 reproduced in FIGS. 1a to 1c, in particular its design with a fastening ring 12, is also to be understood as merely exemplary.

A first rotational-speed sensor 14 (wheel-speed sensor) has been arranged in the sensor housing 10. The first rotational-speed sensor 14 may, for example, have been inserted in a first receiving aperture (not sketched) of the sensor housing 10. By the term "first rotational-speed sensor 14", a first sensitive element is to be understood that has been designed in such a manner that after a mounting of the sensor housing 10, with the first rotational-speed sensor 14 therein, on the vehicle the rotary transducer co-rotating with the rotating wheel of the vehicle triggers a change in at least one first physical quantity in the first rotational-speed sensor 14. By an evaluation of the change in the at least one first physical quantity in the first rotational-speed sensor 14, at least one first item of information relating to a rotary behavior of the wheel (or of a respective axle) equipped with the rotary transducer—such as, for example, a first value of a rotational speed of the wheel (or, to be more precise, of the rotary transducer fitted to the wheel)—can be determined. For example, at least one evaluating device (not sketched) of the wheel-sensor device may have been designed to establish and to output, taking into consideration the change in the at least one first physical quantity in the first rotational-speed sensor 14, the at least one first item of information relating to the rotary behavior of the wheel equipped with the rotary transducer, in particular the first value of the rotational speed. Similarly, however, a first sensor signal relating to the change in the at least one first physical quantity in the first rotational-speed sensor 14 may also be capable of being output to an external electronic evaluating unit which subsequently establishes the at least one first item of information relating to the rotary behavior of the wheel equipped with the rotary transducer. The first rotational-speed sensor 14 may be, in particular, a (first) rotational-speed pick-up.

In addition to the first rotational-speed sensor 14, a second rotational-speed sensor 16 (wheel-speed sensor) has been arranged in the sensor housing 10. The second rotational-speed sensor 16 may, for example, have been inserted in the first receiving aperture or in a second receiving aperture of the sensor housing 10. By the term "second rotational-speed sensor 16", a second sensitive element is to be understood that has been designed in such a manner that after the mounting of the sensor housing 10, with the first rotational-speed sensor 14 and with the second rotational-speed sensor 16 therein, on the vehicle the rotary transducer co-rotating with the rotating wheel triggers the change in the at least one first physical quantity in the first rotational-speed sensor 14 and, in addition, a change in at least one second physical quantity in the second rotational-speed sensor 16. Therefore by an evaluation of the change in the at least one second physical quantity in the second rotational-speed sensor 16 at least one second item of information relating to the rotary behavior of the wheel equipped with the rotary transducer—such as, for example, a second value of the rotational speed of the wheel (or, to be more precise, of the rotary transducer fitted to the wheel)—can also be determined. The determining or establishing of the at least one second item of information relating to the rotary behavior of the wheel equipped with the rotary transducer may be undertaken by means of the at least one evaluating device (not sketched) of the wheel-sensor device and/or (after the output of a second sensor signal relating to the change in the at least one second physical quantity in the second rotational-speed sensor 16) by the external electronic evaluating unit. The second rotational-speed sensor 16 may also be a (further/second) rotational-speed pick-up.

By reason of the equipping of the wheel-sensor device with the two rotational-speed sensors 14 and 16 for the (same) wheel equipped with the rotary transducer, the information and/or values relating to the rotary behavior of the wheel can be determined more reliably. For example, the rotational speed of the wheel can be established more precisely by averaging. Likewise, provided only one of the two rotational-speed sensors 14 and 16 of the (same) wheel ascertains an extreme value, a fault obtaining in the respective rotational-speed sensor 14 or 16 can be reliably inferred. The equipping of the wheel-sensor device with the two rotational-speed sensors 14 and 16 consequently enables an examination of the rotary behavior of the wheel with a greater accuracy and with a lower error-rate. By virtue of the common usability of the two rotational-speed sensors 14 and 16 for the (same) wheel, a quality check of the ascertained information and/or values automatically is also possible. Where appropriate, the presence of a fault in one of the two rotational-speed sensors 14 and 16, or a failure of one of the two rotational-speed sensors 14 and 16, can also be overcome by means of the other of the two rotational-speed sensors 14 and 16. The wheel-sensor device consequently ensures that in such a situation a reliable examination or ascertainment of the rotary behavior of the wheel equipped with the rotary transducer is possible.

The change in the at least one first physical quantity in the first rotational-speed sensor 14, triggered by means of the rotating rotary transducer, preferentially occurs independently of and unaffected by the (additional) change in the at least one second physical quantity in the second rotational-speed sensor 16. Correspondingly, it is also preferred if the change in the at least one second physical quantity in the second rotational-speed sensor 16, triggered by means of the rotating rotary transducer, occurs independently of and unimpaired by the (additional) change in the at least one first physical quantity in the first rotational-speed sensor. The equipping of the wheel-sensor device with the two rotational-speed sensors 14 and 16 (for the same wheel equipped with the rotary transducer) consequently provides an advantageous redundancy.

By the term "rotary transducer", a signal transducer or rotary-signal transducer may be understood. The rotary transducer may be, in particular, a magnetic rotary transducer. The rotary transducer may be, for example, an encoder and/or incremental transducer or incremental wheel. For example, the rotational-speed sensors 14 and 16 may have been designed in such a way that, via a Hall effect by reason of the rotating rotary transducer, a first resistance and/or a first voltage by way of the at least one first physical quantity in the first rotational-speed sensor 14 and a second resistance and/or a second voltage by way of the at least one second physical quantity in the second rotational-speed sensor 16 are changed or varied. However, attention is drawn to the fact that the capacity for further development of the first rotational-speed sensor 14 and/or of the second rotational-speed sensor 16 is not limited to an exploitation of the Hall effect. For example, an anisotropic magnetic effect (AMR), a giant magnetoresistance (GMR) and/or a tunneling magnetoresistance (TMR) may also be utilized instead of, or as a supplement to, the Hall effect for the rotational-speed sensors.

The two rotational-speed sensors 14 and 16 have preferentially been arranged close to one another, without the two rotational-speed sensors 14 and 16 influencing each other. For example, the second rotational-speed sensor 16 may have been positioned "piggyback" on the first rotational-speed sensor 14. In the case of an arrangement of the two rotational-speed sensors 14 and 16 close to one another, the second rotational-speed sensor 16 may exhibit a (minimal) spacing from the passing rotary transducer that is greater than a (minimal) spacing of the first rotational-speed sensor 14 from the passing rotary transducer. Frequently, however, the operational performance of a rotational-speed sensor 14 or 16 is dependent on a (minimal) spacing between the rotational-speed sensor 14 or 16 and the rotary transducer passing it. In advantageous manner in this case, the first rotational-speed sensor 14 may comprise a first type of rotational-speed sensor, and the second rotational-speed sensor 16 may comprise a second type of rotational-speed sensor, differing from the first type of rotational-speed sensor, the second type of rotational-speed sensor being designed or suitable for a smaller (minimal) spacing than the first type of rotational-speed sensor. The first type of rotational-speed sensor or the second type of rotational-speed sensor may be, for example, a type of AMR sensor (anisotropic magnetic effect), a type of GMR sensor (giant magnetoresistance), a type of TMR sensor (tunneling magnetoresistance) and/or a type of Hall sensor, in which case the two types of rotational-speed sensor may differ from one another.

The first rotational-speed sensor 14 and the second rotational-speed sensor 16 may be a first speed-pick-up ASIC 14 and a second speed-pick-up ASIC 16. For example, the second speed-pick-up ASIC 16 as the second rotational-speed sensor 16 may have been positioned "piggyback" on the first speed-pick-up ASIC 14 as the first rotational-speed sensor 14. Such an arrangement or design of the two rotational-speed sensors 14 and 16 permits a complete redundant signal ascertainment and signal evaluation for the wheel (equipped with the rotary transducer). For the purpose of avoiding losses of function, a first type of speed-pick-up ASIC may have been employed for the first speed-pick-up ASIC 14, and a second type of speed-pick-up ASIC, differing from the first type of speed-pick-up ASIC, may have been employed for the second speed-pick-up ASIC 16, the second type of speed-pick-up ASIC being designed or suitable for a smaller (minimal) spacing than the first type of speed-pick-up ASIC. For example, the second speed-pick-up ASIC 16 may be a high-sensitivity speed-pick-up ASIC, in particular a TLE5041plusC.

The sensor housing 10 with the inserted first rotational-speed sensor 14 and with the inserted second rotational-speed sensor 16 may be capable of being mounted on the vehicle (not represented here) adjacent to the (same) wheel and to its assigned rotary transducer in a (common) wheel-bearing device or in a (common) wheel bearing. Attention is drawn to the fact that this capacity for arrangement of the sensor housing 10 is not restricted to a particular type of wheel bearing. Instead of this, the wheel-bearing device or wheel bearing for arrangement of the wheel-sensor device is capable of being designed with great design freedom.

As an advantageous further development, the sensor housing 10 of the wheel-sensor device shown in FIGS. 1a to 1c has a plug component 18, the first rotational-speed sensor 14 and the second rotational-speed sensor 16 each having been connected (directly or via at least one evaluating device) to the plug component 18. By the term "plug component 18", a coupling piece, for example, may be understood, to which at least one appliance and/or at least one cable can be attached. The respective appliance and/or the respective cable can preferentially be attached to the plug component 18 in such a way that a transmission of current, voltage and/or signals between the wheel-sensor device and the at least one appliance attached to the plug component 18 and/or at least one further appliance that has been connected to the at least one cable attached to the plug component 18 is guaranteed. The plug component 18 may be, for example, a plug housing or plug socket or a plug or connector. Instead of a plug component 18 formed (directly) on the sensor housing 10, the plug component 18 may also have been connected to the sensor housing 10 via a cable.

The plug component 18 is preferentially a three-pin, four-pin or 2-×-2-pin plug component 18. (These terms also encompass two cable outlets, each with a 2-pin plug, or one cable outlet with a 4-pin plug.) The advantages of these design options of the plug component 18 will be discussed in more detail below.

The plug component 18 can be directly or indirectly connected to a first voltage source (first current source) of the vehicle in such a way that a first voltage (a first supply current) can be made available at least to the first rotational-speed sensor 14. The plug component 18 can preferentially be directly or indirectly connected additionally to a second voltage source (second current source) of the vehicle in such a way that a second voltage (a second supply current) can be made available at least to the second rotational-speed sensor 16. In this way, even in the event of a (total) operational failure of one of the two voltage sources (current sources) a reliable operation of at least one of the two rotational-speed sensors 14 and 16 assigned to the (same) wheel is still ensured. Although the (total) operational failure of one of the two voltage sources (current sources) may lead to an operational failure of one of the two rotational-speed sensors 14 and 16, the other of the rotational-speed sensors 14 and 16 remains fully operational (by reason of its voltage supply or supply of current which continues to be ensured). The rotary behavior of the wheel assigned to the rotational-speed sensors 14 and 16 can therefore, despite the (total) operational failure of one of the two voltage sources (current sources), still continue to be examined or ascertained. The first voltage source (first current source) and the second voltage source (second current source) may be, for example, a vehicle battery and/or a high-voltage network.

In particular, the first voltage source (current source) can be used for the purpose of supplying voltage or current to an electromechanical brake-force booster of the vehicle equipped with the wheel-sensor device, whereas the second voltage source (current source) is utilized for the purpose of supplying voltage or current to at least one current-operated hydraulic component of the braking system of the vehicle, such as, for example, at least one electrically drivable valve, at least one pump motor and/or at least one motorized piston/cylinder device, preferentially the entire hydraulic system or ESP system of the braking system. In this case, despite a (total) operational failure of one of the two voltage sources (current sources), a part of the braking system of the vehicle equipped with the wheel-sensor device that is sufficient for implementing or assisting a braking operation, together with one of the two rotational-speed sensors 14 and 16, is still fully operational.

In addition, it is advantageous that the plug component 18 can be directly or indirectly connected to a first electronic control unit of the vehicle in such a way that the at least one first sensor signal relating to the change in the at least one first physical quantity in the first rotational-speed sensor 14 and/or in the first item of information, derived therefrom, relating to the rotary behavior of the wheel (equipped with the rotary transducer) can be output to the first electronic control unit, whereas the plug component can be (simultaneously) directly or indirectly connected to a second electronic control unit of the vehicle in such a way that the at least one second sensor signal relating to the change in the at least one second physical quantity in the second rotational-speed sensor 16 and/or in the second item of information, derived therefrom, relating to the rotary behavior of the wheel (equipped with the rotary transducer) can be output to the second electronic control unit. The redundancy of the two rotational-speed sensors 14 and 16 for the (same) wheel is consequently capable of being secured also with respect to a (total) failure of one of the two electronic control units of the vehicle. In this way, it can be ensured that, even in the event of a (total) failure of one of the two electronic control units, at least one of the two sensor signals and/or one of the items of information relating to the rotary behavior of the wheel can still be utilized by means of the still operational electronic control unit for the purpose of driving at least one vehicle component.

In an advantageous embodiment, the first electronic control unit may have been designed for driving or operating the electromechanical brake-force booster, whereas the at least one current-operated hydraulic component can be driven or operated by means of the second electronic control unit. A lapsing ability to employ the electromechanical brake-force booster or the at least one current-operated hydraulic component 18 (for example, by reason of a failure of one of the two voltage sources) can be compensated quickly in this case, taking into consideration at least one of the two sensor signals and/or one of the items of information relating to the rotary behavior of the wheel, by means of an adapted drive of the vehicle component that is still operational.

In the embodiment shown in FIGS. 1a to 1c, a capacitor 20 has also been assigned to the first rotational-speed sensor 14. Equipping the second rotational-speed sensor 16 with a (specific) capacitor can be dispensed with. Dispensing with equipping the second rotational-speed sensor 16 with a (specific) capacitor enables a minimization of the wheel-sensor device. In particular, in this case a single mounting bore may suffice for both rotational-speed sensors 14 and 16 and the (single) capacitor 20.

Merely in exemplary manner, in the embodiment shown in FIGS. 1a to 1c each of the rotational-speed sensors 14 and 16 has been formed on a specific chip 22a and 22b (silicon chip). Alternatively, the two rotational-speed sensors 14 and 16 may also have been formed on a common chip. Similarly, the number of four current bars 24a to 24d represented schematically in FIGS. 1a and 1b-said current bars 24a and 24b extending from the first rotational-speed sensor 14 (or, to be more exact, the first chip 22a thereof) to the plug component 18, and said current bars 24c and 24d extending from the second rotational-speed sensor 16 (or, to be more exact, the second chip 22b thereof) to the plug component 18—is to be interpreted only as an example. As will be explained in more detail below, equipping each of the rotational-speed sensors 14 and 16 with two current bars 24a to 24d assigned thereto is not necessary.

FIGS. 2 to 12 show schematic overall or partial representations of further embodiments of the wheel-sensor device.

The wheel-sensor devices represented schematically (at least partially) in FIGS. 2 to 12 may, unless anything to the contrary has been described below, exhibit at least some of the properties of the preceding embodiment.

Figure 2:
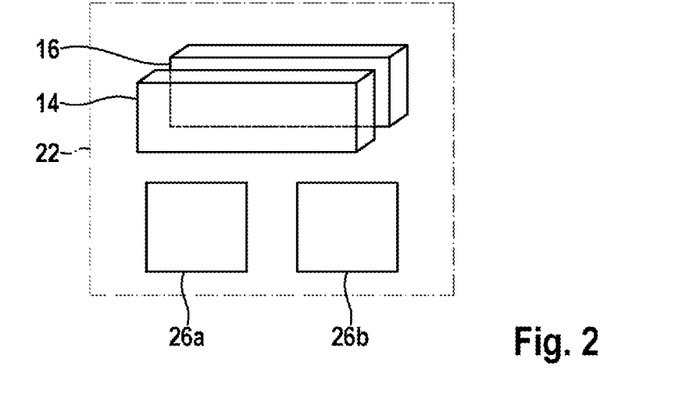
FIGS. 2 to 12 schematic overall or partial representations of further embodiments of the wheel-sensor device.

In the case of the wheel-sensor device represented only partially in FIG. 2, the two rotational-speed sensors 14 and 16 have been fastened (in different planes) to the same chip 22 (silicon chip). By means of such an arrangement of the two rotational-speed sensors 14 and 16, a triggering of the desired change in the respective at least one physical quantity in the rotational-speed sensors 14 and 16 by means of the rotary transducer moving past them is reliably ensured. The change in the respective at least one physical quantity can therefore be established reliably by means of at least one evaluating device 26a and 26b, whereby by means of the at least one evaluating device 26a and 26b a first/second item of information, corresponding to the change, relating to the rotary behavior of the wheel equipped with the rotary transducer—such as, for example a first/second value of the rotational speed of the wheel —can be established and output. In the embodiment shown in FIG. 2, a specific evaluating device 26a or 26b has been assigned to each rotational-speed sensor 14 and 16. The two evaluating devices 26a and 26b are completely separated from one another electrically.

Figure 3:
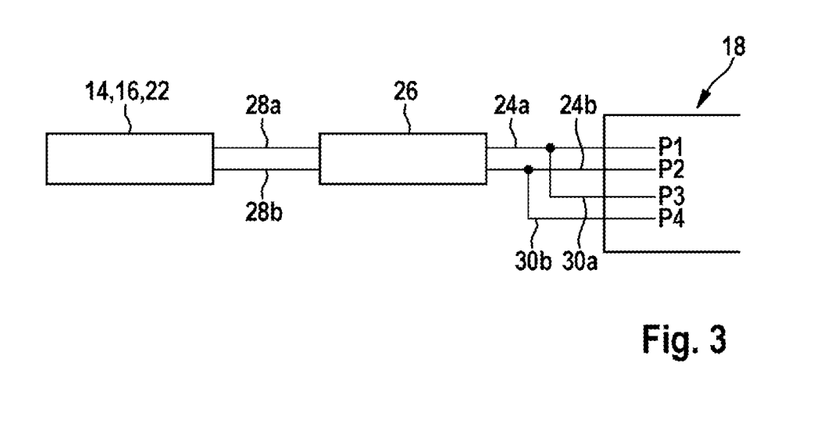

In the embodiment shown in FIG. 3, a common evaluating device 26 has been assigned to the chip 22 with the rotational-speed sensors 14 and 16. For this purpose the chip 22 has been connected to the evaluating device 26 via two current bars 28a and 28b. Two further current bars 24a and 24b extend from the evaluating device 26 to the 4-pin plug component 18. From each of the two current bars 24a and 24b a respective further current bar 30a and 30b branches off to the plug component 18, so that each of the two current bars 24a and 24b and each of the two further current bars 30a and 30b protrude as a total of four pins P1 to P4 into the plug component 18. This may also be paraphrased by the statement that the current interface between the evaluating device 26 and the plug component 18 has been designed by a doubling of the current bars 24 and 24b for the 4-pin plug component 18. By reason of the outgoing lead from the chip 22 or from the evaluating device 26 via only two current bars 24a, 24b, 28a and 28b, and by reason of the corresponding splitting in the vicinity of the plug component 18, production costs of the wheel-sensor device shown in FIG. 3 have been reduced. At the same time, the 4-pin plug component 18 facilitates a forwarding of signals from the two rotational-speed sensors 14 and 16 to two different electronic control units (control instruments).

Figure 4:
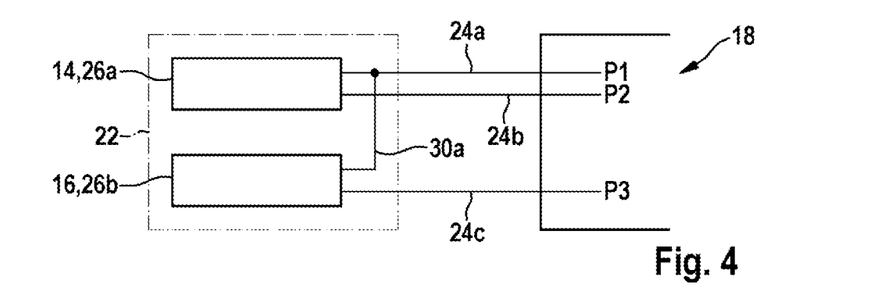

Also in the case of the wheel-sensor device shown in FIG. 4, the two rotational-speed sensors 14 and 16 have been arranged on the same chip 22. However, in the case of the embodiment shown in FIG. 4 each of the evaluating devices 26a and 26b has been integrated into the rotational-speed sensor 14 or 16 assigned thereto. From the first rotational-speed sensor 14 (with the first evaluating device 26a integrated therein) two current bars 24a and 24b extend to the 3-pin plug component 18. From the second rotational-speed sensor 16 (with the second sensor device 26b integrated therein) only one current bar 24c extends to the 3-pin plug component 18. Via a further current bar 30a, the second rotational-speed sensor 16 (with the second evaluating device 26b integrated therein) has been connected to one of the two current bars 24a or 24b of the first rotational-speed sensor 14 (with the first evaluating device 26a integrated therein). Even in this case a redundant voltage supply (current supply) of the two rotational-speed sensors 14 and 16 (with the evaluating devices 26a and 26b integrated therein) is still possible by means of different voltage sources (current sources). By virtue of the design of the plug component 18 shown in FIG. 4 as a 3-pin plug component 18 (with the three pins P1 to P3), one current bar can be eliminated. In particular, the respective supply line can be routed to the plug component 18 only once.

Figure 5:
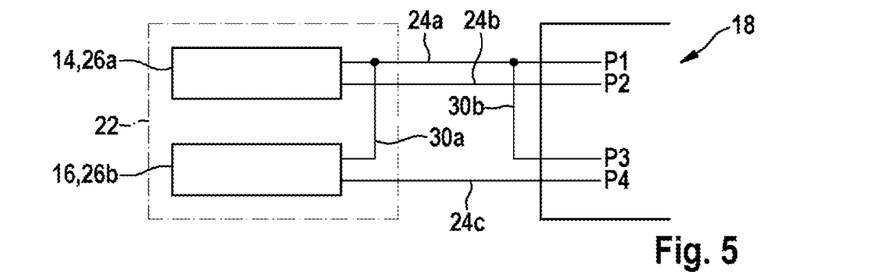

The wheel-sensor device shown in FIG. 5 also exhibits a current bar 24a or 24b acting as a common supply line. However, the plug component 18 shown in FIG. 5 takes the form of a 4-pin plug component 18 (with four pins P1 to P4). For this purpose, a further contactable current bar 30b, which has been connected to the respective supply line 24a or 24b, has been formed on the plug component 18. By virtue of the design of the plug component 18 as a 4-pin plug component 18, an additional securing of the wheel-sensor device against a failure of components pertaining to its provision of voltage and current is possible.

Figure 6:
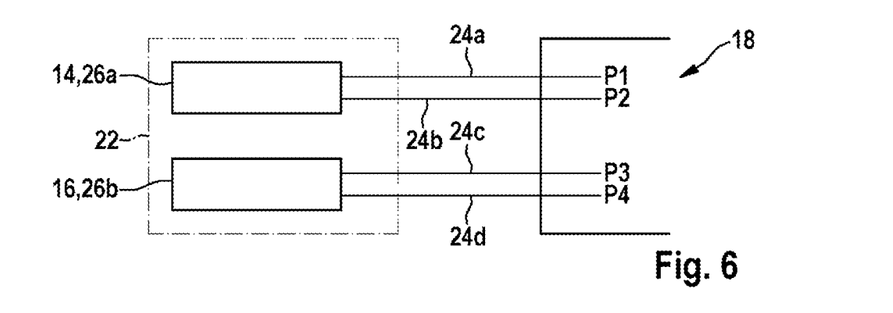

In the embodiment shown in FIG. 6, in each instance two current bars 24a and 24b or 24c and 24d extend from each of the two rotational-speed sensors 14 and 16 (with the evaluating device 26a or 26b respectively integrated therein). The wheel-sensor device shown in FIG. 6 is therefore distinguished by a complete redundant signal generation and signal routing right up to the tapping of the plug component 18.

Figure 7:
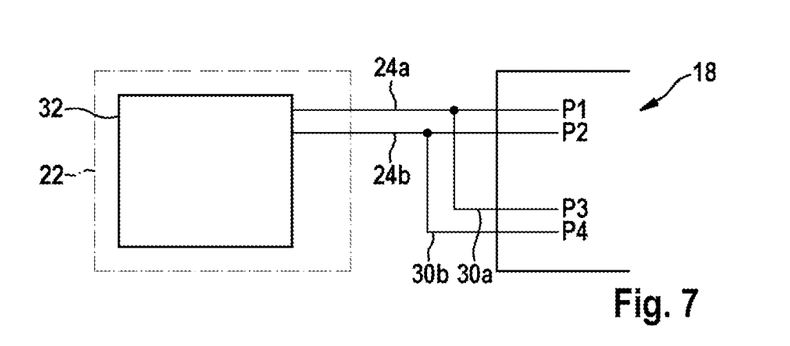

In the case of the wheel-sensor device shown in FIG. 7, the two rotational-speed sensors 14 and 16 (and the evaluating device 26 assigned to them) have been integrated into a common unit 32 on a single chip 22. Two current bars 24a and 24b extend from the unit 32 to the plug component 18. Through a doubling of the interface currents for the interfaces by means of connecting bars, a flow of current at the interface can ideally be split 50:50.

Figure 8:
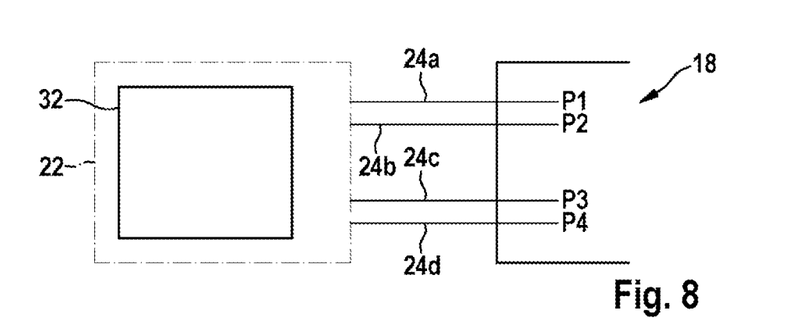

In contrast, in the case of the wheel-sensor device shown in FIG. 8 four current bars 24a to 24d extend from the chip 22 to the plug component 18.

Figure 9:
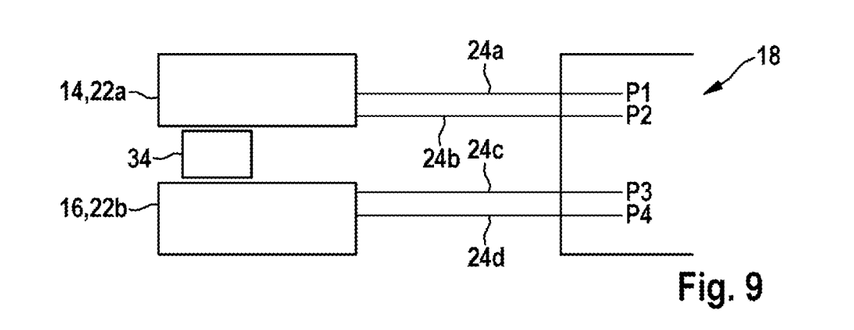
Figure 10:
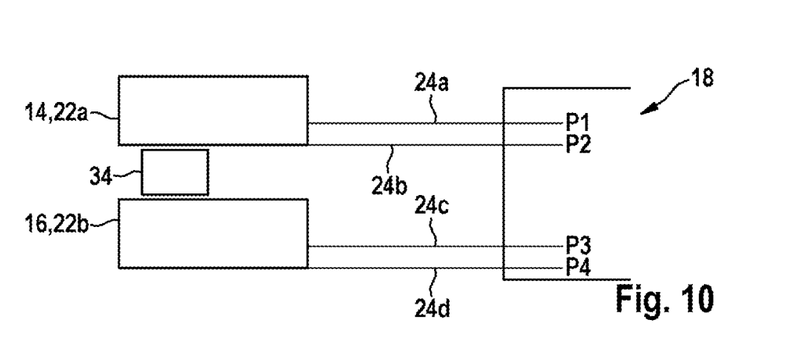

In the embodiments shown in FIGS. 9 and 10, a magnet 34 has been arranged between the first chip 22a (with the first rotational-speed sensor 14) and the second chip 22b (with the second rotational-speed sensor 16). In the embodiment shown in FIG. 9, the plug component 18 takes the form of a 4-pin plug component 18. In contrast, in the embodiment shown in FIG. 10 the plug component 18 has been designed as a 2-×-2-pin plug component 18.

Figure 11:
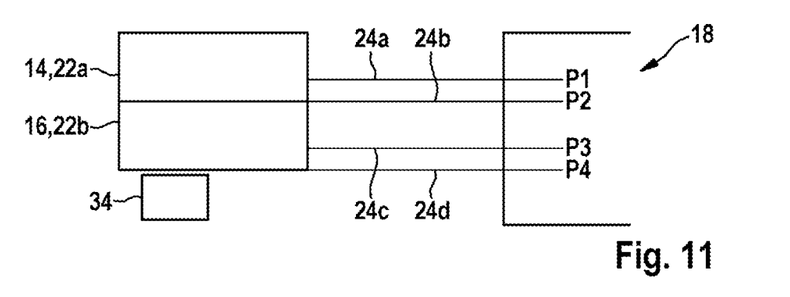

As can be discerned in FIG. 11, the magnet 34 may also have been arranged on a side of the two rotational-speed sensors 14 and 16 directed away from the rotary transducer moving past it. In exemplary manner, in the embodiment shown in FIG. 11 the second chip 22b (with the second rotational-speed sensor 16) is situated between the magnet 34 and the first chip 22a (with the first rotational-speed sensor 14). Also in the case of such an arrangement of the magnet 34, a good interaction of the rotational-speed sensors 14 and 16 with the rotary transducer is ensured.

Figure 12:
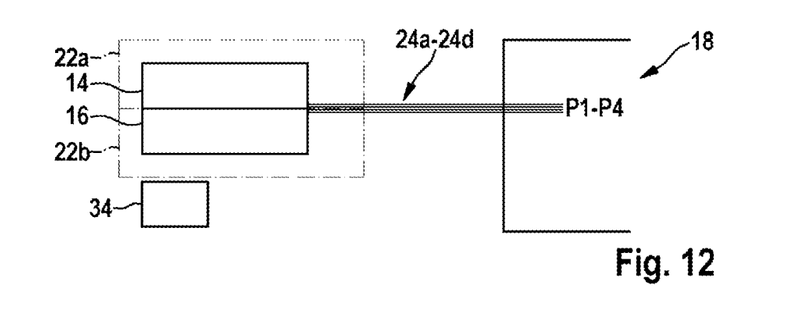

In the embodiment shown in FIG. 12, the two chips 22a and 22b have been brought toward one another in such a way that a first surface of the first chip 22a, provided with the first rotational-speed sensor 14, has been aligned with a second surface of the second chip 22b, provided with the second rotational-speed sensor 16, and the two rotational-speed sensors 14 and 16 have been "stacked". Preferentially, there is (almost) no air gap between the first rotational-speed sensor 14 and the second rotational-speed sensor 16. Each two current bars 24a and 24b or 24c or 24d extend from each of the rotational-speed sensors 14 and 16 to the plug component 18. Also in this case, the magnet 34 may be situated on a side of the chips 22a and 22b directed away from the rotary transducer moving past it.

In all the embodiments of the wheel-sensor device described above, the rotational-speed sensors 14 and 16 (possibly together) may have been molded or embedded in a thermoplastic material. Once again, attention is drawn to the fact that equipping the wheel-sensor device with the magnet 34 is merely optional. Instead of the magnet 34, a back bias (BB) may also have been arranged on the wheel-sensor device, or equipping the wheel-sensor device with a (specific) magnet or back bias (BB) may be dispensed with entirely.

All the wheel-sensor devices described above may be designated as rotational-speed sensors with redundant rotational-speed pick-ups. The number of (plug) pins may have been increased from two to four. In all the wheel-sensor devices described above, a further redundant sensor signal is made available (under the boundary condition of the least possible mutual influencing of operational performance as well as the greatest possible robustness as regards operational safety). In addition, it is possible for all the wheel-sensor devices described above to be designed in such a way that the additional formation of the second rotational-speed sensor 16 therein barely influences their external dimensions. Even a receptacle of the respective rotational-speed sensor 14 and 16 may remain (almost) unchanged. All the wheel-sensor devices described above can therefore be easily mounted by utilizing a mounting bore which, as a rule, is already present on the wheel of the vehicle.

A vehicle equipped with a wheel-sensor device described above has been well designed—by reason of the redundant acquisition of rotational speed and angular velocity—for implementing a vehicle-dynamics control, such as, for example, a "congestion pilot" function. A failure of the ESP system or of the electromechanical brake-force booster in a vehicle of such a type can also be overcome more easily and in more driver-friendly manner.

Figure 13:
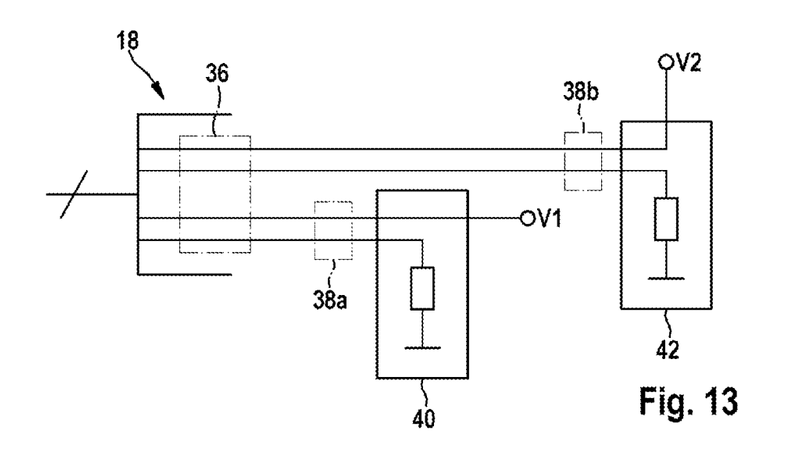
FIG. 13 a schematic representation of an embodiment of the connecting component.

FIG. 13 shows a schematic representation of an embodiment of the connecting component.

The connecting component represented schematically in FIG. 13 can interact with one of the wheel-sensor devices described above. For this purpose the connecting component includes a plug-component contact part 36 which can be attached to the plug component 18 of the wheel-sensor device. In addition, the connecting component has a first connecting part or connector 38a which can be connected or attached to the first voltage source V1 and/or to the first electronic control unit (not represented). Moreover, the connecting component has been equipped with a second connecting part or connector 38b which can be connected or attached to the second voltage source V2 and/or to the second electronic control unit (not sketched). In exemplary manner, in the embodiment shown in FIG. 13 the first connecting part or connector 38a has been attached to an ESP system 40 supplied by the first voltage source V1, whereas the second connecting part or connector 38b has been attached to an electromechanical brake-force booster 42 supplied by the second voltage source V2. This, however, is to be interpreted only as an example.

Attention is drawn to the fact that in the case of the connection of the resistors of components 40 and 42 shown in FIG. 13 (with identical resistances) there is a doubling of the current signals output by the wheel-sensor device. Therefore no changes have to be made to components 40 and in order to ensure the interaction thereof with the wheel-sensor device.

Figure 14:
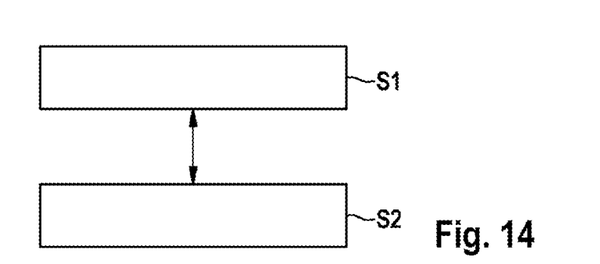
FIG. 14 a flow chart for elucidating an embodiment of the production method.

FIG. 14 shows a flow chart for elucidating an embodiment of the production method.

All the wheel-sensor devices described above can be produced by means of the production method described in the following. However, attention is drawn to the fact that the feasibility of the production method is not limited to production of these wheel-sensor devices.

In a method step S1, a first rotational-speed sensor is arranged in a sensor housing of the wheel-sensor device. Beforehand, at the same time, or thereafter, in a method step S2 a second rotational-speed sensor is additionally arranged adjacent to the first rotational-speed sensor in the sensor housing. Method steps S1 and S2 are implemented in such a manner that after a mounting of the sensor housing, with the first rotational-speed sensor and with the second rotational-speed sensor therein, on the vehicle a rotary transducer co-rotating with a rotating wheel of the vehicle triggers a change in at least one first physical quantity in the first rotational-speed sensor and, in addition, a change in at least one second physical quantity in the second rotational-speed sensor. Examples of the first rotational-speed sensor and of the second rotational-speed sensor have already been mentioned above.

Figure 15:
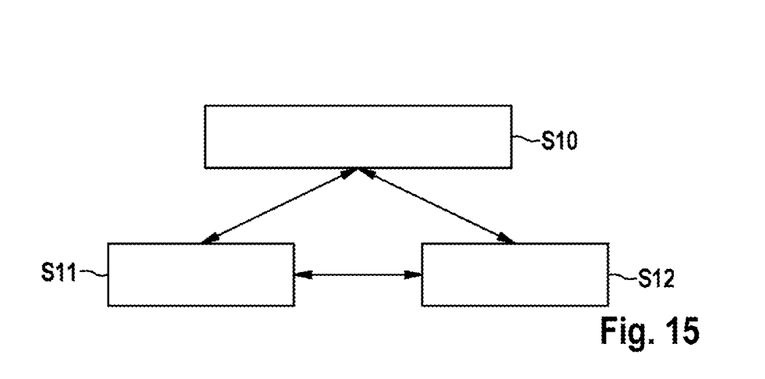
FIG. 15 a flow chart for elucidating an embodiment of the method for mounting a wheel-sensor device.

FIG. 15 shows a flow chart for elucidating an embodiment of the method for mounting a wheel-sensor device.

In the course of implementing the method described herein, the wheel-sensor device is arranged or mounted on the vehicle in a method step S10 in such a manner that the rotary transducer co-rotating with the rotating wheel triggers the change in the at least one first physical quantity in the first rotational-speed sensor and, in addition, the change in the at least one second physical quantity in the second rotational-speed sensor. One of the wheel-sensor devices described above, for example, may be employed as wheel-sensor device.

The wheel-sensor device is preferentially directly or indirectly connected in an optional method step S11 to a first voltage source of the vehicle in such a way that a first voltage is made available at least to the first rotational-speed sensor, in which case the wheel-sensor device is directly or indirectly connected additionally to a second voltage source of the vehicle in such a way that a second voltage is made available at least to the second rotational-speed sensor. In addition, the wheel-sensor device can be directly or indirectly connected to the first electronic control unit of the vehicle in method step S11 or in a further optional method step S12 in such a way that in the course of an operation of the wheel-sensor device the at least one first sensor signal relating to the change in the at least one first physical quantity in the first rotational-speed sensor and/or in the first item of information, derived therefrom, relating to the rotary behavior of the wheel is output to the first electronic control unit. Moreover, the wheel-sensor device can be directly or indirectly connected to the second electronic control unit of the vehicle in method step S11 or in method step S12 in such a way that in the course of the operation of the wheel-sensor device the at least one second sensor signal relating to the change in the at least one second physical quantity in the second rotational-speed sensor and/or in the second item of information, derived therefrom, relating to the rotary behavior of the wheel is output to the second electronic control unit 42.

Method steps S10, S11 and S12 can be implemented in any order and/or at least partially at the same time.

The invention claimed is:

1. A wheel-sensor device for a vehicle, comprising:
   a sensor housing mounted on the vehicle; and
   a first rotational-speed sensor arranged in the sensor housing;
   a second rotational-speed sensor arranged in the sensor housing in addition to the first rotational-speed sensor; and
   a rotary transducer co-rotating with a rotating wheel of the vehicle and configured to trigger a change in at least one first physical quantity in the first rotational-speed sensor and another change in at least one second physical quantity in the second rotational-speed sensor,
   wherein the sensor housing includes a plug component configured to connect to the first rotational-speed sensor and the second rotational-speed sensor, the plug component configured to be directly or indirectly connected to:
      a first voltage source of the vehicle, such that a first voltage is made available at least to the first rotational-speed sensor, and
      a second voltage source of the vehicle, such that a second voltage is made available at least to the second rotational-speed sensor, and
   wherein the first voltage source and the second voltage source are independent from one another such that operational failure of one of the first and second voltage sources does not affect availability of the other of the first and second voltage sources.

2. The wheel-sensor device as claimed in claim 1, wherein:
   the plug component is configured to be directly or indirectly connected to a first electronic control unit of the vehicle so as to enable at least one first sensor signal to be outputted to the first electric control unit, the at least one first sensor signal relating to at least one of (i) the change in the at least one first physical quantity in the first rotational-speed sensor, and (ii) a change in a first item of information, derived from the change in the at least one first physical quantity, relating to a rotary behavior of the rotating wheel; and the plug component is configured to be directly or indirectly connected to a second electronic control unit of the vehicle so as to enable at least one second sensor signal to be outputted to the second electronic control unit, the at least one second sensor signal relating to at least one of the change in the at least one second physical quantity in the second rotational-speed sensor, and a change in a second item of information, derived from the change in the at least one second physical quantity, relating to the rotary behavior of the rotating wheel.

3. The wheel-sensor device as claimed in claim 1, wherein the sensor housing, with the first rotational-speed sensor and the second rotational-speed sensor is configured to be mounted on the vehicle adjacent to the rotary transducer in a wheel-bearing device assigned to the wheel.

4. The wheel-sensor device as claimed in claim 1, further comprising:
a connecting component configured to interact with the wheel-sensor device and including a first connecting part or connector configured to be connected or attached to at least one of a first voltage source and a first electronic control unit;
a second connecting part or connector configured to be connected or attached to at least one of a second voltage source and a second electronic control unit; and
a plug-component contact part configured to be attached to the plug component.

5. The wheel-sensor device as claimed in claim 1, wherein:
the first rotational-speed sensor is arranged in the sensor housing of the wheel-sensor device such that after a mounting of the sensor housing, with the inserted first rotational-speed sensor, on the vehicle, the rotary transducer co-rotating with the rotating wheel of the vehicle triggers a change in the at least one first physical quantity in the first rotational-speed sensor; and
the second rotational-speed sensor is arranged adjacent to the first rotational-speed sensor in the sensor housing such that after a mounting of the sensor housing, with the inserted first rotational-speed sensor and with the inserted second rotational-speed sensor, on the vehicle, the rotary transducer co-rotating with the rotating wheel triggers the change in the at least one first physical quantity in the first rotational-speed sensor and a change in at least one second physical quantity in the second rotational-speed sensor.

6. The sensor housing as claimed in claim 1, wherein the plug component is a three-pin plug component, a four-pin plug component, or a 2-×-2 plug component.

7. A method for mounting a wheel-sensor device on a vehicle, the wheel-sensor device including a sensor housing, a first rotational-speed sensor arranged in the sensor housing, and a second rotational-speed sensor arranged in the sensor housing, the method comprising:
mounting the wheel-sensor device on the vehicle;
triggering a change in at least one first physical quantity in the first rotational-speed sensor via a rotary transducer co-rotating with a rotating wheel based on a manner in which the wheel-sensor device is mounted on the vehicle;
triggering a change in at least one second physical quantity in the second rotational-speed sensor via the rotary transducer co-rotating with the rotating wheel based on a manner in which the wheel-sensor device is mounted on the vehicle;
connecting the wheel-sensor device to a first electronic control unit of the vehicle;
outputting to the first electronic control unit, based on a manner in which the wheel-sensor device is connected to the first electronic control unit, at least one first sensor signal relating to at least one of (i) the change in the at least one first physical quantity in the first rotational-speed sensor and (ii) a change in a first item of information, derived from the change in the at least one first physical quantity, relating to a rotary behavior of a rotating wheel;
connecting the wheel-sensor device to a second electronic control unit of the vehicle; and
outputting to the second electronic unit, based on a manner in which the wheel-sensor device is connected to the second electronic control unit, at least one second sensor signal relating to at least one (i) the change in the at least one second physical quantity in the second rotational-speed sensor and (ii) a change in a second item of information, derived from the change in the at least one second physical quantity, relating to the rotary behavior of the rotating wheel.

8. The method as claimed in claim 7, further comprising:
connecting the wheel-sensor device to a first voltage source of the vehicle to make available a first voltage at least to the first rotational-speed sensor; and
connecting the wheel-sensor device to a second voltage source of the vehicle to make available a second voltage at least to the second rotational-speed sensor.

* * * * *